United States Patent [19]

Hori et al.

[11] Patent Number: 4,564,916
[45] Date of Patent: Jan. 14, 1986

[54] DIAGNOSING SPEED SENSOR DEFECT OF AN AUTOMOTIVE VEHICLE ELECTRONIC CONTROL SYSTEM

[75] Inventors: Shinichi Hori, Anjo; Yasuichi Ohnishi, Kariya; Masahiro Ueda; Masahiko Noba, both of Toyota, all of Japan

[73] Assignees: Nippondenso Co., Ltd., Kariya; Toyota Jidosha Kabushiki Kaisha, Toyota, both of Japan

[21] Appl. No.: 402,797

[22] Filed: Jul. 27, 1982

[30] Foreign Application Priority Data

Jul. 31, 1981 [JP] Japan .................................. 56-121242

[51] Int. Cl.$^4$ ...................... G08B 21/00; G08B 29/00; G06F 11/32
[52] U.S. Cl. ............................... 364/551; 123/179 A; 123/198 D; 340/62; 364/431.10
[58] Field of Search ...................... 364/431.01, 431.10, 364/551; 123/179 A, 179 B, 179 BG, 198 DB, 198 DC, 198 D; 340/62

[56] References Cited

U.S. PATENT DOCUMENTS

| | | |
|---|---|---|
| 4,192,279 | 3/1980 | Maisch et al. ................... 123/179 A |
| 4,233,599 | 11/1980 | Brearley ............................ 340/62 X |
| 4,246,493 | 1/1981 | Beeghly ....................... 123/198 DC |
| 4,402,286 | 9/1983 | Pagel et al. ..................... 123/179 B |
| 4,414,937 | 11/1983 | Ueda et al. ................... 123/198 DC |

FOREIGN PATENT DOCUMENTS 2541122  3/1977  Fed. Rep. of Germany ...... 364/551

OTHER PUBLICATIONS

Bowler: Throttle Body Fuel Injection–An Integrated Engine Control System, Society of Automotive Engineers, Paper #800164, pp. 1, 2 of interest.

*Primary Examiner*—Felix D. Gruber
*Attorney, Agent, or Firm*—Cushman, Darby & Cushman

[57] ABSTRACT

In a diagnosis apparatus for an electronic control system adapted to vehicles and including a speed sensor for producing speed pulses responsive to the actual vehicle speed, a switch produces a diagnosis signal when actuated upon request for self-diagnosis in operation of the control system. A computer is responsive to the diagnosis signal to discriminate change of the level of each speed pulse during movement of the vehicle and to produce a first signal in dependence upon discrimination of change of the level of each speed pulse and a second signal in dependence upon discrimination of unchangeable state of the level of each speed pulse, and an indicator indicates an error in operation of the speed sensor in response to the second signal and normal operation of the speed sensor in response to the first signal.

7 Claims, 7 Drawing Figures

DIAGNOSING SPEED SENSOR DEFECT OF AN AUTOMOTIVE VEHICLE ELECTRONIC CONTROL SYSTEM

BACKGROUND OF THE INVENTION

The present invention relates to electronic control systems for use in automotive vehicles, and more particularly to a method and apparatus for diagnosing the operation of electronic control systems for vehicles of the type which include a sensor assembly for detecting movement of the vehicle and are arranged to be operated in relation to an electric signal from the sensor assembly.

For example, an engine automatic control system for automotive vehicles has been proposed in which the engine is automatically driven in response to operation of a starting mechanism for effecting start of the vehicle to maintain the engine rotation while the vehicle is moving and the engine is automatically stopped when the vehicle stops moving, both operations being carried out without operating the ignition switch. In such engine automatic control system, motion of the vehicle is detected by a speed sensor assembly such that the engine control circuit operates responsive to changes in amplitude of a speed pulse signal from the sensor assembly.

In operation of the control system, it is, therefore, presumable that if the speed sensor assembly is out of order due to failure in its contact to a connector, disconnection or erroneous earth in its wiring or the like prior to start of the vehicle, the engine is automatically stopped during travel of the vehicle, resulting in unexpected trouble for the operator. In this respect, it is difficult to inspect presence of an error in operation of the speed sensor assembly in its assembled condition in such a way to run the vehicle in a manufacturing or service factory. It is also difficult for the operator to inspect an error in operation of the speed sensor assembly when involved in such unexpected trouble as described above.

SUMMARY OF THE INVENTION

Accordingly, the primary object of the present invention is to provide a diagnosis method and apparatus for electronic control systems in use with an automotive vehicle, which is capable of diagnosing an error in operation of the speed sensor assembly in a simple manner during movement of the vehicle within a short distance.

In the preferred embodiment of the present invention, the primary object is accomplished by provision of a method of diagnosing the operation of an electronic control system for automotive vehicles, the control system including detecting means for detecting movement of the vehicle to produce a signal indicative of the vehicle movement, which method comprises the steps of:

producing a diagnosis signal upon request for self-diagnosis in operation of the control system;

discriminating, responsive to the diagnosis signal, as to change of the signal from the detecting means while the vehicle is moving;

producing a first output signal in dependence upon discrimination of change of the signal from the detecting means and a second output signal in dependence upon discrimination of unchangeable state of the signal from the detecting means; and indicating an error in operation of the detecting means in response to the second output signal and normal operation of the detecting means in response to the first output signal.

The present invention is also directed to an apparatus of diagnosing the operation of an electronic control system for automotive vehicles, the control system including a speed sensor assembly for producing a series of speed pulses responsive to the actual vehicle speed, which apparatus comprises:

means for producing a diagnosis signal therefrom when actuated upon request for self-diagnosis in operation of the control system;

computer means arranged for discriminating, responsive to the diagnosis signal, the level of each of the speed pulses at a first stage in movement of the vehicle and for discriminating the level of each of the speed pulses at a second stage in movement of the vehicle to compare it with the previous level of the speed pulse at the first stage, the computer means being arranged for producing a first output signal when the successive level of the speed pulse is different from the previous level of the speed pulse and for producing a second output signal when the successive level of the speed pulse is the same as the previous level of the speed pulse; and indication means for indicating an error in operation of the speed sensor assembly in response to the second output signal and normal operation of the speed sensor assembly in response to the first output signal.

BRIEF DESCRIPTION OF THE DRAWINGS

Additional objects and advantages of the present invention will be more apparent from the following detailed description of the preferred embodiment thereof when taken together with the accompanying drawings in which.

DESCRIPTION OF THE PREFERRED EMBODIMENT

Figure 1:
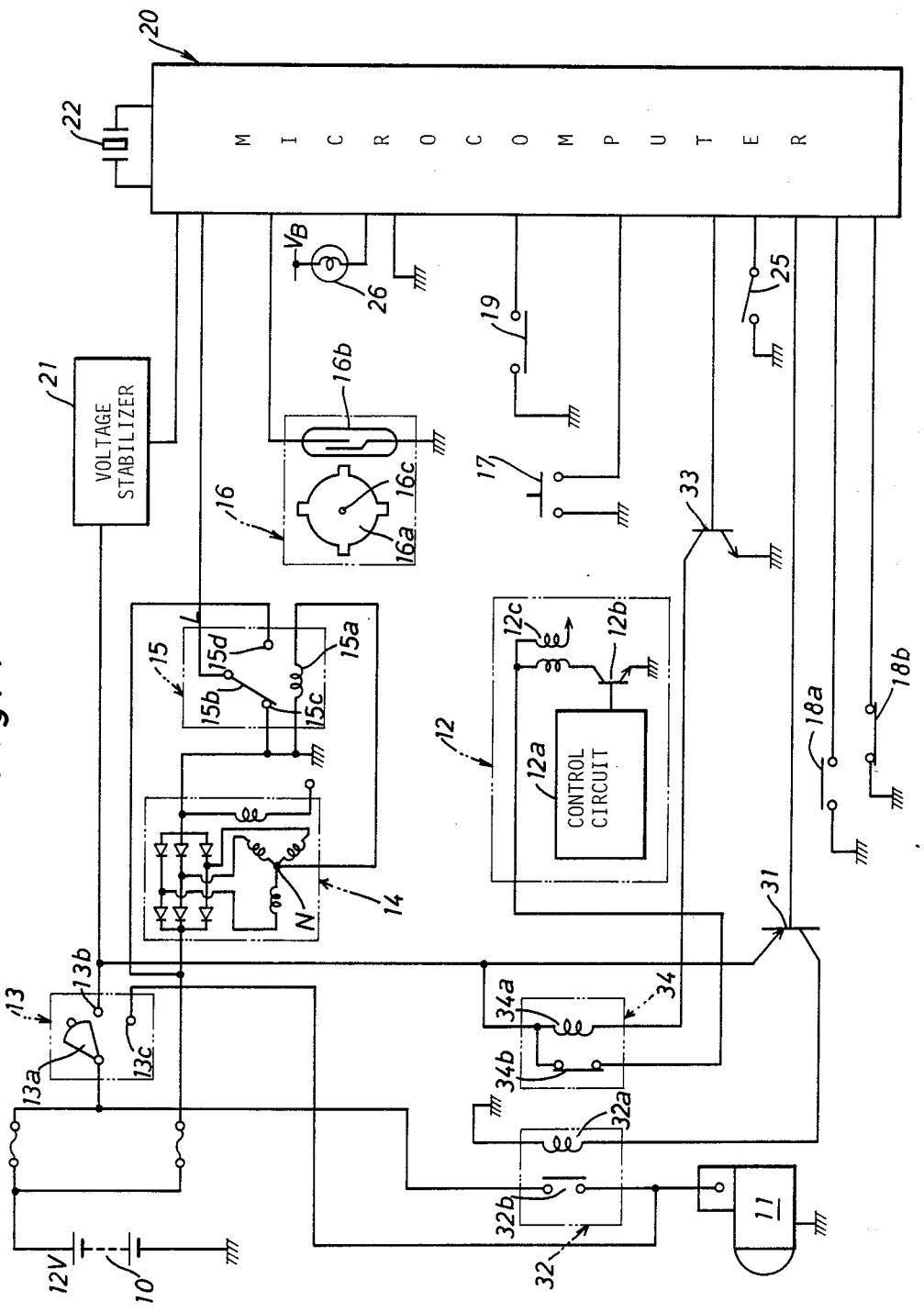
FIG. 1 is a block diagram of a diagnosis method and apparatus in accordance with the present invention which is adapted to an engine automatic control system for an automotive vehicle.

Referring now to the drawings, particularly in FIG. 1, the reference numeral 11 designates a starter motor for an internal combustion engine, and the reference numeral 12 designates an ignition circuit of the engine. The starter motor 11 is connected to an electric DC power source 10 in the form of a vehicle battery through an ignition switch 13. When a movable contact 13a of switch 13 is temporarily connected to a fixed contact 13c, the starter motor 11 is operated by supply of an electric current from power source 10 to crank the engine. The ignition circuit 12 includes a control circuit 12a and an ignition coil 12c connected to the control circuit 12a through a transistor 12b. The control circuit 12a is connected to a signal generator which is assembled within a distributor of the engine. The transistor 12b is energized in response to an electric signal from the signal generator under control of the control circuit 12a and is deenergized in response to disappearance of the electric signal from the signal generator. The ignition coil 12c is energized in response to energization of the transistor 12b and generates a spark voltage upon deenergization of the primary winding thereof caused by deenergization of the transistor 12b, the spark voltage being applied to the distributor of the engine.

Connected between the power source 10 and a regulator relay 15 is an alternator 14 which is arranged to generate an AC voltage at a neutral point N of the stator-coil thereof when driven by the engine and to convert it to a DC voltage to be applied to the power source 10. The regulator relay 15 includes an electromagnetic coil 15a and a movable contact 15b which is selectively connected to an earth terminal 15c and a fixed contact 15d. The electromagnetic coil 15a is connected at its opposite ends to the neutral point N of the stator-coil and the earth terminal 15c, and the fixed contact 15d is connected to the power source 10. During deenergization of the electromagnetic coil 15a, the movable contact 15b is connected to the earth terminal 15c to generate a low level voltage $L_o$ at its output terminal L. When the electromagnetic coil 15a is energized by an AC voltage appearing at the neutral point N of the stator-coil, the movable contact 15b is connected to the fixed contact 15d to generate a high level voltage $H_i$ at its output terminal L.

A microcomputer 20 is connected to the regulator relay 15, a speed sensor assembly 16, a setting switch 17, first and second clutch switches 18a, 18b, a door switch 19 and a diagnosis switch 25. The speed sensor assembly 16 includes a disk 16a of permanent magnet and a reed-switch assembly 16b in magnetic coupling with each projection of disk 16a. The disk 16a is fixed to a speedometer cable 16c which is arranged to be driven by an output shaft of a power transmission of the vehicle. When the disk 16a is rotated by speedometer cable 16c, the reed-switch 16b acts to magnetically detect each projection of the disk 16a so as to produce a speed pulse signal including a series of speed pulses indicative of the actual speed of the vehicle. The setting switch 17 is in the form of a normally open switch of the self-return type which is arranged at an appropriate place in the passenger compartment of the vehicle to produce a set signal therefrom when temporarily closed. Both the clutch switches 18a and 18b are associated with a clutch pedal of the vehicle. The first clutch switch 18a is in the form of a normally open switch which is arranged to be closed by full depression of the clutch pedal to produce a first clutch signal therefrom, while the second clutch switch 18b is in the form of a normally closed switch which is arranged to be opened in response to depression of the clutch pedal to produce a second clutch signal therefrom. The second clutch signal disappears in response to release of the clutch pedal. The door switch 19 is in the form of a normally closed switch which is arranged in a vehicle door structure to be closed by opening of the vehicle door to produce a door signal therefrom. The door signal disappears in response to closing of the vehicle door. The diagnosis switch 25 is in the form of a normally open switch of the self-return type which is arranged at an appropriate place in the passenger compartment of the vehicle to produce a diagnosis signal therefrom when temporarily closed.

Figure 3:
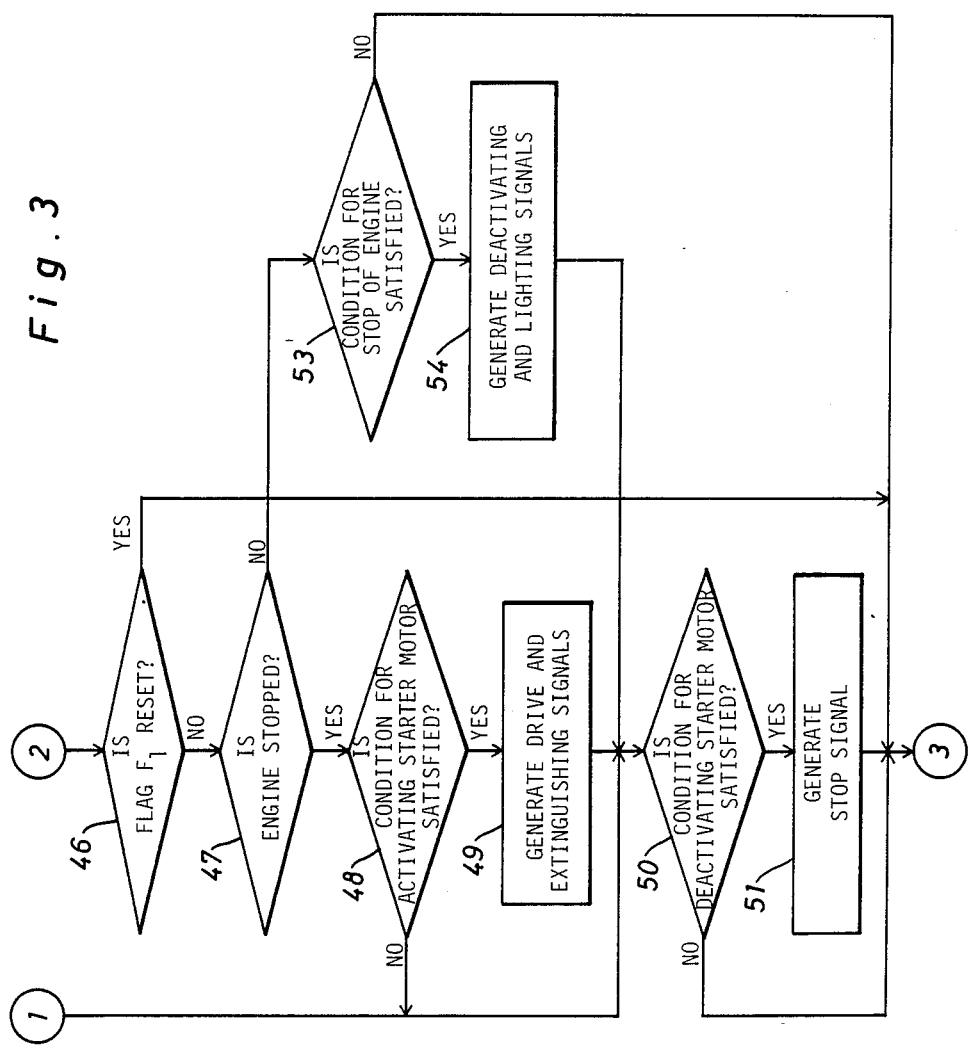
Figure 4:
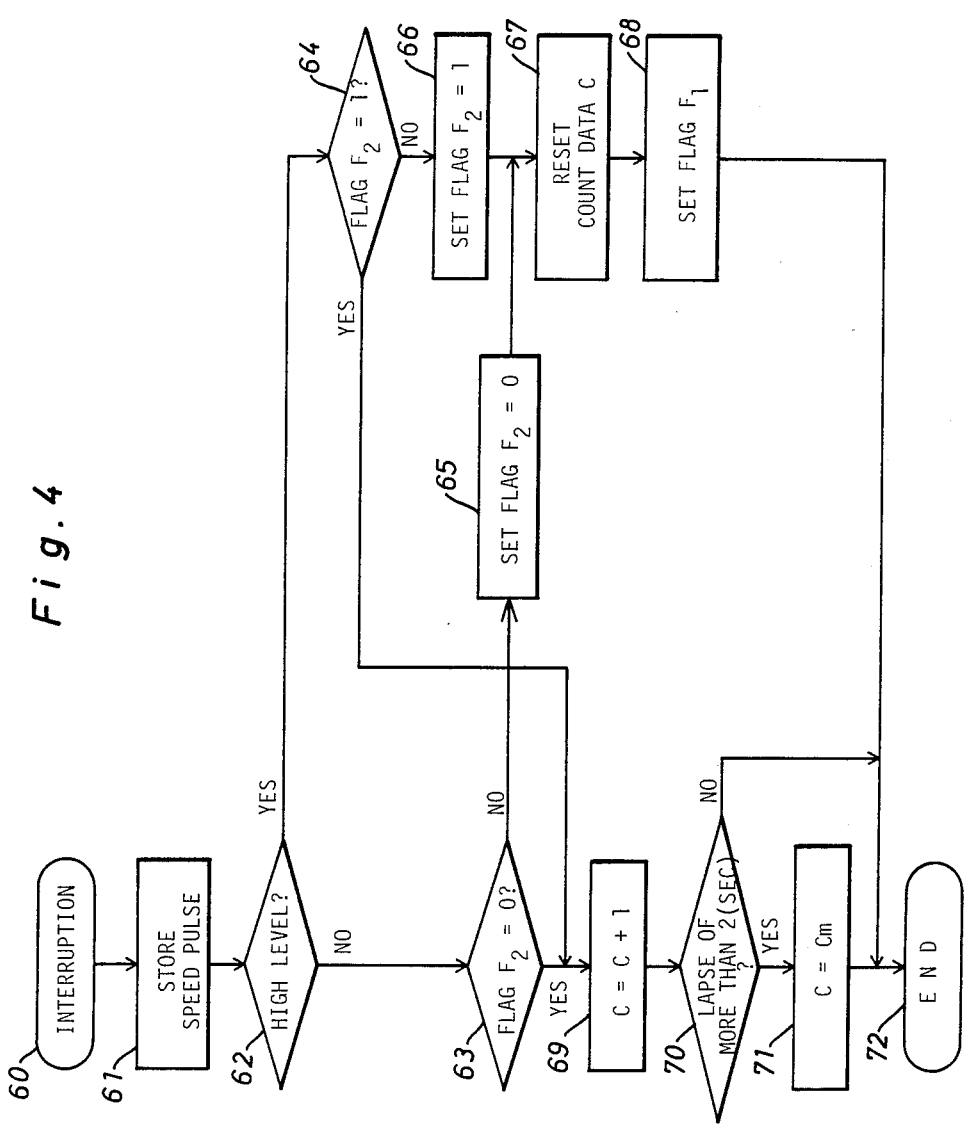
FIG. 4 is a flow-chart illustrating an interruption control program executed by the microcomputer.

The microcomputer 20 is arranged to be ready for its operation in response to a constant voltage (for instance 5 volts) which a voltage stabilizer 21 produces upon receiving electric power from power source 10 when the ignition switch is closed. The computer 20 comprises a central processing unit or CPU, an input-output device or I/O, a read only memory or ROM, a random access memory or RAM and a clock circuit which are connected to each other through a bus line. I/O receives the speed pulse signal from speed sensor 16 and applies the pulses (when the vehicle is moving) to RAM and receives the low or high level voltage $L_o$ or $H_i$ from regulator relay 15, a set signal from setting switch 17, clutch signals from first and second clutch switches 18a, 18b, a door signal from door switch 19 and a diagnosis signal from diagnosis switch 25 to apply them to CPU. The clock circuit is cooperable with a crystal oscillator 22 to produce clock signals at a predetermined frequency. ROM is arranged to previously store a main control program and an interruption control program illustrated by each flow-chart in FIGS. 2 to 4, which programs are executed by CPU in the computer 20 as described in detail later.

CPU includes an interruption timer which initiates the measurement of a predetermined period of time, such as for example, 1 milli-second, when the computer 20 is operating and is reset upon completion of the measurement. Thus, CPU executes the main control program in response to the clock signals from the clock circuit and ceases the execution of the main control program upon each time the interruption timer times out its 1 milli-second period to execute the interruption control program. During such alternative execution of the control programs, the computer 20 produces output signals necessary for activating or deactivating the starter motor 11, for energizing or deenergizing the ignition coil 12c and for lighting or extinguishing an indication lamp 26. In this instance, the execution of the main control program by CPU is repetitively conducted within 10 milli-seconds after each execution of the program.

The computer 20 is further connected to the indication lamp 26 and to a starter relay 32 and an ignition relay 34 respectively through transistors 31 and 33. The transistor 31 is connected at its base to I/O of computer 20 and at its emitter to the fixed contact 13b of ignition switch 13 to be energized by receiving a drive signal from CPU of the computer during closure of ignition switch 13 and to be deenergized in response to a stop signal from CPU of the computer. The transistor 33 is grounded at its emitter and connected at its base to I/O of the computer 20 to be deenergized by receiving an activating signal from CPU of the computer and to be energized by receiving a deactivating signal from CPU of the computer, as described in detail later. The starter relay 32 includes an electromagnetic coil 32a and a normally open switch 32b. The electromagnetic coil 32a is grounded at its one end and connected at its other end to the collector of transistor 31 to be energized by supply of an electric current from the power source 10 during energization of the transistor 31 and to be deenergized in response to deenergization of the transistor 31. The normally open switch 32b of relay 32 is interposed between the power source 10 and starter motor 11 to be closed in response to energization of coil 32a to connect the starter motor 11 with the power source 10. The normally open switch 32b is opened in response to deenergization of coil 32a to disconnect the starter motor 11 from the power source 10.

The ignition relay 34 includes an electromagnetic coil 34a which is connected at its one end to the fixed contact 13b of ignition switch 13 and at its other end to the collector of transistor 33 to be deenergized during deenergization of transistor 33 and to be energized by supply of an electric current from the power source 10 in response to energization of transistor 33. The ignition relay 34 also includes a normally closed switch 34b which is maintained in its closed position during deenergization of coil 34a to permit supply of the electric current to the ignition coil 12c from the power source 10. When the electromagnetic coil 34a is energized, the normally closed switch 34b is opened to disconnect the ignition coil 12c from the power source 10. The indication lamp 26 is provided at an appropriate place in the passenger compartment of the vehicle and arranged to be lit in response to a lighting signal from CPU so as to inform the operator of automatic stop of the engine. The lamp 26 is arranged to be extinguished in response to an extinguishing signal from CPU to inform the operator of automatic start of the engine. The lamp 26 is responsive to a first flashing signal from CPU to be intermittently lit in a first flashing manner defined by a time chart shown in FIG. 6(A) and is also responsive to a second flashing signal from CPU to be intermittently lit in a second flashing manner defined by a time chart shown in FIG. 6(B).

Figure 2:
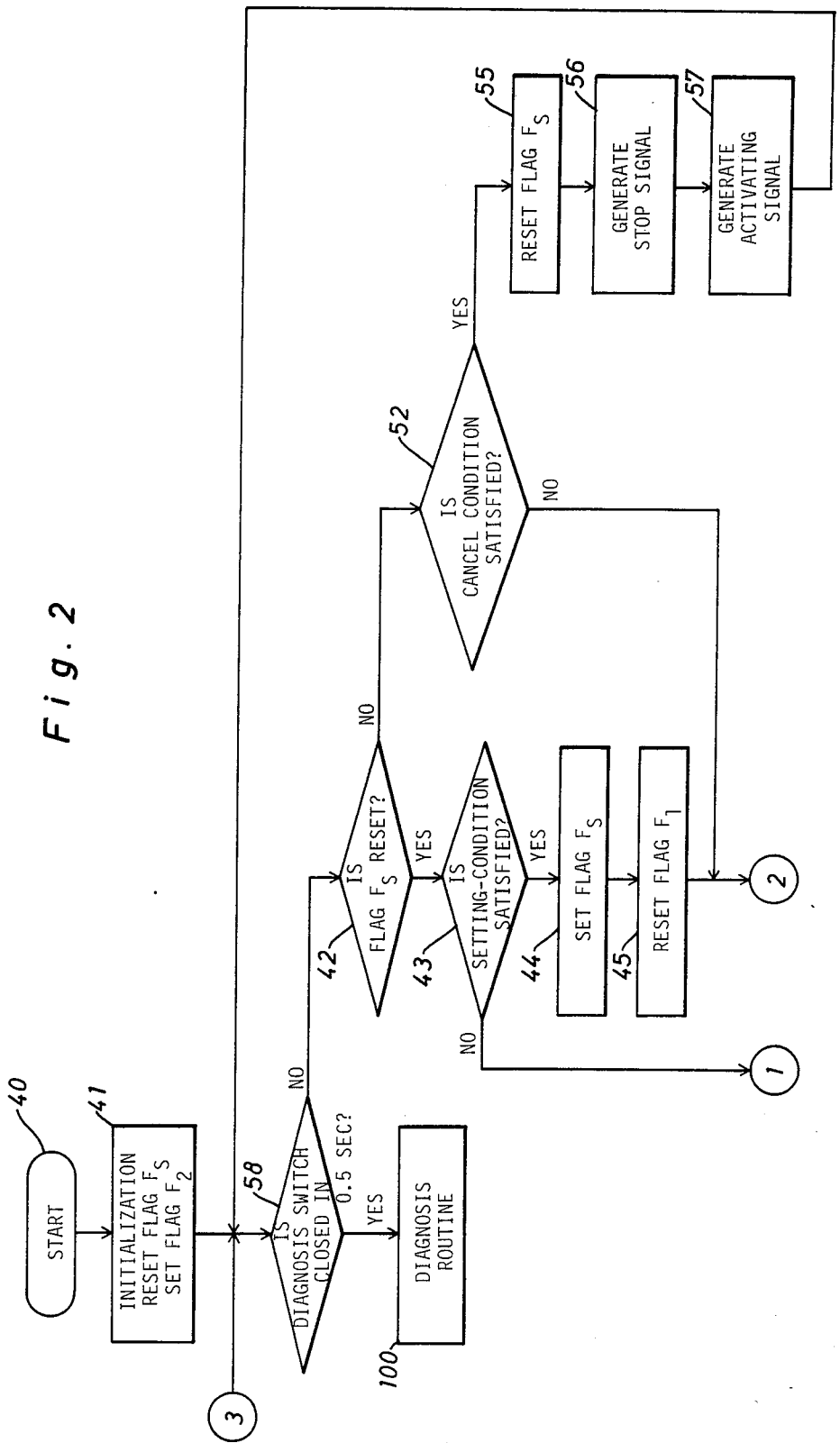
FIGS. 2 and 3 are flow-charts illustrating a main control program executed by the microcomputer of FIG. 1.

In operation, when the movable contact 13a of ignition switch 13 is connected to the fixed contact 13b when the vehicle is initially started, computer 20 is conditioned in its operation by receiving the constant voltage from stabilizer 21 to operate the interruption timer of CPU and to initiate the execution of the main control program at a step 40 of the flow-chart shown in FIG. 2. Subsequently, when the movable contact 13a of ignition switch 13 is temporarily connected to the fixed contact 13c, the starter motor 11 cooperates with the ignition circuit 12 to start the engine. Then, the regulator relay 15 generates a high level voltage $H_i$ therefrom under control of the alternator 14 driven by the engine. At this time, it is assumed that the reed-switch 16b of speed sensor 16 is closed in magnetic coupling relationship with the disk 16a when the vehicle is stopped so that the speed pulse signal has a low level (no pulses).

When the main control program proceeds to a step 41 under the above condition, CPU acts to initialize the computer 20, to reset a flag $F_s$ and to set a flag $F_2=0$ due to the actual or low level of the speed pulse signal from speed sensor 16. In this embodiment, the flag $F_s$ represents the fact that a setting condition for automatic start and stop control of the engine is satisfied. The setting condition is arranged to be satisfied by such three factors as generation of a high level voltage $H_i$ from regulator relay 15, disappearance of a door signal from door switch 19 and generation of a set signal from the setting switch 17. When the main control program proceeds to a step 58 for discriminating whether or not the diagnosis switch 25 is continuously closed for 0.5 seconds, CPU serves to discriminate as "NO" because of no actuation of the switch 25 and then the main control program proceeds to a step 42 where CPU discriminates whether the flag $F_s$ is reset or not. When the answer at step 42 becomes "YES" due to the initially reset flag $F_s$, the main control program proceeds to a step 43 for discriminating whether the setting condition is satisfied or not. At this stage, the answer to this question is discriminated as "NO" because at least the setting switch 17 is in its open position, and then the main control program proceeds to a step 50 (See FIG. 3) where the CPU discriminates whether or not a condition for deactivation of the starter motor 11 is satisfied. In this embodiment, the condition for deactivation of the starter motor 11 is arranged to be satisfied by generation of a high level voltage $H_i$ from the regulator relay 15. At this stage, the answer at step 50 is discriminated as "YES" because the regulator relay 15 is generating a high level voltage $H_i$ therefrom due to rotation of the engine, and then CPU returns the main control program to the step 58 through a step 51.

Assuming that the vehicle door is closed to extinguish a door signal which has previously produced from the door switch 19 and that the setting switch 17 is temporarily actuated to produce a set signal therefrom, CPU discriminates as "YES" at step 43 because of satisfaction of the setting condition for automatic start and stop control of the engine. Then, CPU acts to set the flag $F_s$ at a step 44 and the main control program proceeds to the following step 45 where the CPU resets a flag $F_1$ which represents the fact that the level of the speed pulse signal from sensor 16 is changing. When the main control program proceeds to a step 46 through step 45, CPU discriminates as "YES" on a basis of the reset flag $F_1$ to return the program to the step 58 of FIG. 2. Then, CPU discriminates as "NO" at the following step 42 in dependence upon the set flag $F_s$ and the control program proceeds to a step 52 for discriminating a condition for cancelling of the setting condition. In this embodiment, the cancel condition is arranged to be satisfied by either generation of a door signal from door switch 19 or generation of a set signal from setting switch 17 under setting of the flag $F_s$. Thus, CPU discriminates as "NO" at step 52 because of lack of both the door and set signals, and the control program returns to the step 58 through step 46.

When the vehicle is traveling along a road, the actual travelling speed of the vehicle is detected by speed sensor 16 sequentially by counting pulses of the speed pulse signal which is applied to the computer 20. If a predetermined period of time for interruption lapses, CPU acts to cease the execution of the main control program and to initiate the execution of the interruption control program at a step 60 in FIG. 4. At a step 61, CPU acts to store an instantaneous level of the speed pulse signal from sensor 16 in RAM and the interruption control program proceeds to the following step 62 for discriminating as to the stored level of the speed pulse signal. In case the stored level of the speed pulse signal is high, CPU discriminates as "YES" at step 62 and the program proceeds to a step 64 where CPU acts to discriminate the level of flag $F_2$. At this stage, CPU discriminates as "NO" because of the flag $F_2=0$ at step 41 and the program proceeds to a step 66 where CPU sets the flag $F_2=1$. When the program proceeds to the following step 67 through step 66, CPU acts to reset a count data C of a counter in RAM and subsequently acts at a step 68 to set the flag $F_1$ so as to end the execution of the interruption control program at a final step 72. In this embodiment, the counter in RAM is responsive to the clock signals from the clock circuit to count a lapse of time while a speed pulse signal from sensor 16 is maintained at the same level. Alternatively, if CPU discriminates as "NO" at the prior step 62, the program will proceed to a step 63 where CPU discriminates as to the flag $F_2=0$.

After the execution of such interruption control program, the main control program proceeds to its step 46 where CPU discriminates as "YES" because of the set of flag $F_1$ at the prior step 68. Thus, the control program proceeds to the following step 47 where CPU discriminates whether or not the vehicle engine is stopped. At step 47, CPU discriminates as "NO" due to generation of the high level voltage $H_i$ from regulator relay 15 and the control program proceeds to a step 53 so as to discriminate a condition for stop of the engine. In this embodiment, the condition for stop of the engine is arranged to be satisfied by the fact that a second clutch signal from the second clutch switch 18b disappears and simultaneously the count data C by the counter in RAM indicates a predetermined lapse of time, for instance 2 seconds, which is required for temporarily stopping the vehicle after depression of a brake pedal of the vehicle. If the predetermined lapse of time in not indicated by the count data C, CPU discriminates as "NO" at step 53 to return the control program to the step 58.

When the interruption control program is subsequently executed by CPU as described above, an instantaneous level of a speed pulse signal appearing from sensor 16 is stored in RAM at step 61. Assuming that at this stage the stored level of the speed pulse signal is low, CPU discriminates as "NO" at step 62 and the program proceeds to step 63 where CPU discriminates whether the flag $F_2$ is zero or not. As a result, CPU discriminates as "NO" because of the flag $F_2=1$ at step 66 in the previous execution, and it acts to set the flag $F_2=0$ at the following step 65. Thereafter, CPU acts to reset the count data C at step 67 and to set the flag $F_1$ at step 68 so as to end the execution of the interruption control program. When the main control program proceeds to step 46 after the execution described above, CPU discriminates as "NO" at step 47 to discriminate as "NO" respectively at step 53. Alternatively, if the answer at step 62 is "YES" during the execution of the interruption control program, CPU discriminates as "YES" at step 64 because of the flag $F_2=1$ in the previous execution, and the program proceeds to a step 69 for updating the count data C in RAM. From the above description, it will be understood that the engine rotation during travel of the vehicle is maintained under control of the computer 20 in dependence upon change of the level of speed pulse signal from sensor 16.

When the brake pedal is depressed to temporarily stop the vehicle, for instance at a crossing, the second clutch switch 18b is opened by full depression of the clutch pedal prior to stopping of the vehicle to generate a second clutch signal therefrom during the execution of the control programs respectively through the steps 42, 52, 46, 47, 53 and 58 and through the steps 65 (or 66) and 68. After arrest of the vehicle, the second clutch signal from switch 18b disappears in dependence upon release of the clutch pedal, and the speed sensor 16 produces a speed pulse signal having a low level if the reed-switch 16b of sensor 16 is closed by magnetic coupling with disk 16a. Under such condition, the low level of the speed pulse signal from sensor 16 is memorized in RAM at step 61 during successive execution of the interruption control program, and CPU discriminates as "NO" at step 62 an the program proceeds to step 63. At this stage, CPU discriminates as "YES" at step 63 because of the flag $F_2=0$ in the previous execution, and the program proceeds to the following step 69 where CPU sets the count data C=1. When the program proceeds to a step 70 through step 69, CPU discriminates as to lapse of more than 2 seconds after reset of the count data C at step 67. When the answer to this question becomes "NO" due to the count data C=1, the control program will end at step 72. Additionally, in the embodiment, the count data C=1 corresponds with lapse of time of 1 milli-second necessary for executing the interruption control program.

When the main control program proceeds to step 53 after the above execution of the interruption control program, CPU discriminates as "NO" in dependence upon the count data C=1 at the prior step 70 to return the program to the step 58. During successive execution of the control programs, CPU discriminates as "NO" at steps 53 and 70 until it lapses 2 seconds after reset of the count data C at step 67. Upon lapse of more than 2 seconds after reset of the count data C, CPU discriminates as "YES" at step 70 to set the count data C=Cm, corresponding with 2 seconds, at the following step 71 and subsequently discriminates as "YES" at step 53 due to satisfaction of the condition for stop of the engine. When the main control program proceeds to a step 54, CPU produces deactivating and lighting signals which are applied to be transistor 33 and lamp 26 respectively. Thus, the transistor 33 is turned on in response to the deactivating signal from CPU to energize the ignition relay 34 so as to open the normally closed switch 34b. As a result, the supply of electric current to ignition coil 12c is interrupted to stop the engine, and the regulator relay 15 generates a low level voltage $L_o$ therefrom. Meanwhile, the lamp 26 is lit in response to the lighting signal from CPU to inform the operator of stop of the engine under the automatic start and stop control.

When the main control program proceeds to step 47 through steps 50, 58 during stop of the engine, CPU descriminates as "YES" due to the low level voltage $L_o$ from relay 15 and also discriminates at the following step 48 whether a condition for activation of the starter motor 11 is satisfied or not. In this embodiment, the condition for activation of the starter motor 11 is arranged to be satisfied by presence of a low level voltage $L_o$ from regulator relay 15 and a first clutch signal from first clutch switch 18a. Under release of the clutch pedal during stop of the engine, the first clutch switch 18a does not produce any first clutch signal. As a result, CPU discriminates as "NO" at step 48 and subsequently discriminates as "NO" at step 50 to return the program to the step 58.

If the reed-switch 16b of sensor 16 is in its open position during arrest of the vehicle, the speed sensor 16 produces a speed pulse signal having a high level. Under such condition, the high level of the speed pulse signal from sensor 16 is memorized in RAM at step 61 during successive execution of the interruption control program, and CPU discriminates as "YES" at step 62. Then, CPU discriminates as "NO" at the following step 64 because of the flag $F_2=0$ in the previous execution and subsequently acts to set the flag $F_2=1$ at step 66. When the interruption control program returns to step 64, CPU discriminates as "YES" because of the flag $F_2=1$ in the previous execution and acts to update the count data C=C+1 at the following step 69. Thereafter, CPU discriminates as "NO" at steps 70 and 53 until at lapses 2 seconds after reset of the count data C at step 67, as previously described. Upon lapse of 2 seconds after reset of the count data C, CPU discriminates as "YES" at step 70 to set the count data C=Cm and subsequently discriminates as "YES" at step 53. Thus, the main control program proceeds to step 54 where the computer 20 produces a deactivating signal for automatically stopping the engine and also produces a lighting signal for lighting the lamp 26, as previously described. As a result, the regulator relay 15 cooperates with the alternator 14 to generate a low level voltage $L_o$, and the operator is informed of automatic stop of the engine, as previously described.

When the clutch pedal is fully depressed to restart the vehicle, the first clutch switch 18a is closed to generate a first clutch signal therefrom, and in turn, CPU discriminates as "YES" at step 48 during successive execution of the main control program due to the low level voltage $L_o$ from regulator relay 15 and the first clutch signal from switch 18a. This means that the condition for activation of the starter motor 11 has been satisfied. When the main control program proceeds to the following step 49, CPU acts to generate a drive signal and an extinguishing signal which are applied to the transistor 31 and the lamp 26 respectively. Then, the transistor 31 is turned on in response to the drive signal from CPU to energize the starter relay 32 which closes the switch 32b to supply the starter motor 11 with the electric current from the power source 10. Thus, the starter motor 11 is automatically activated by the supply of electric current to start the engine, and the regulator relay 15 cooperates with the alternator 14 to generate a high level voltage $H_i$ therefrom. Meanwhile, the lamp 26 is extinguished in response to the extinguishing signal from CPU to inform the operator of start of the engine under automatic start and stop control. Under such condition, CPU discriminates as "YES" at step 50 due to the high level voltage $H_i$ to generate a stop signal at a step 51. Then, the transistor 31 is turned off in response to the stop signal from CPU to deenergize the starter relay 32, and the switch 32b of relay 32 opens to block the supply of electric current to the starter motor 11. Thus, the starter motor 11 is deactivated, and the vehicle is conditioned to restart under the automatic start and stop control of the engine.

If the vehicle door is opened during such transient arrest of the vehicle as described above, the door switch 19 is closed to generate a door signal therefrom. Under this condition, CPU discriminates as "YES" at step 52 due to the door signal from switch 19 and acts to reset the flag $F_s$ at the following step 55. Subsequently, CPU acts to generate a stop signal at step 56 and to generate an activating signal at step 57. This means that the setting condition for the automatic start and stop control has been canceled. Thus, the transistor 31 is turned off in response to the stop signal from CPU to maintain the switch 32b of relay 32 in its open position so as to disable automatic activation of the starter motor 11, while the transistor 33 is turned off in response to the activating signal from CPU to maintain the switch 34b of ignition relay 34 in its closed position so as to allow supply of the electric current to the ignition coil 12c from the power source 10. After cancel of the setting condition for the automatic control, the engine is conditioned to start only by operation of the ignition switch 13.

In operation of the above embodiment, it is presumable that the actual speed of the vehicle may not be detected due to damage of the speed sensor 16, for example caused by disconnection of the speedometer cable 16c. Under such unexpected condition, the starter motor 11 is activated by operation of the ignition switch 13 to start the engine, and the regulator relay 15 generates a high level voltage $H_i$ under control of the alternator 14 in operation of the engine. When the main control program proceeds to step 42 through step 41 after the vehicle door is closed and the setting switch 17 is actuated, CPU discriminates as "YES" because of the reset of flag $F_s$ at step 41 or 55. At the following step 43, CPU discriminates as "YES" because the setting condition is satisfied at the prior stage. Subsequently, CPU acts to set the flag $F_s$ at step 44 and to reset the flag $F_1$ at step 45 and further discriminates as "YES" at step 46 on a basis of the reset flag $F_1$ to return the program to step 58. Then, CPU discriminates as "NO" at the following step 42 in dependence upon the set flag $F_s$ and the program proceeds to step 52. At this stage, the condition for cancel of the setting condition may not be satisfied due to disappearance of both the door and set signals. Thus, CPU discriminates as "NO" at step 52 to return the program to step 58 through step 46, and the engine rotation is maintained during successive execution of the main control program through steps 42, 52, 46 and 58 without execution of the interruption control program through the step 68.

When the vehicle restarts under the above condition, the speed sensor 16 does not produce any speed pulse signal in spite of rotation of the output shaft of the power transmission, and the reed-switch 16b remains in its open or closed position. This results in inhibit of execution of the interruption control program through the step 68. Thus, the engine rotation is reliably maintained during travel of the vehicle under successive execution of the main control program through steps 42, 52, 46 and 58 as described above.

As easily understood from the above description, it will be recognized by the operator that because the engine cannot be automatically stopped, for instance at temporary arrest of the vehicle, the automatic start and stop control for the engine may malfunction and should be inspected at a proper automobile service station. When the diagnosis switch 25 is closed while the vehicle with the ignition switch 13 closed is moved over a predetermined short distance, for example a few meters at the automobile service station, a diagnosis signal is generated from the diagnosis switch 25 and applied to the computer 20. When the main control program proceeds to the step 58, CPU acts to discriminate as "NO" because lapse of time during continuous appearance of the diagnosis signal from the closed switch 25 is shorter than 0.5 seconds at this stage. This means that the main control program proceeds from the step 58 to the following step 42 where CPU conducts automatic start and stop control for the engine, as previously described.

Figure 5:
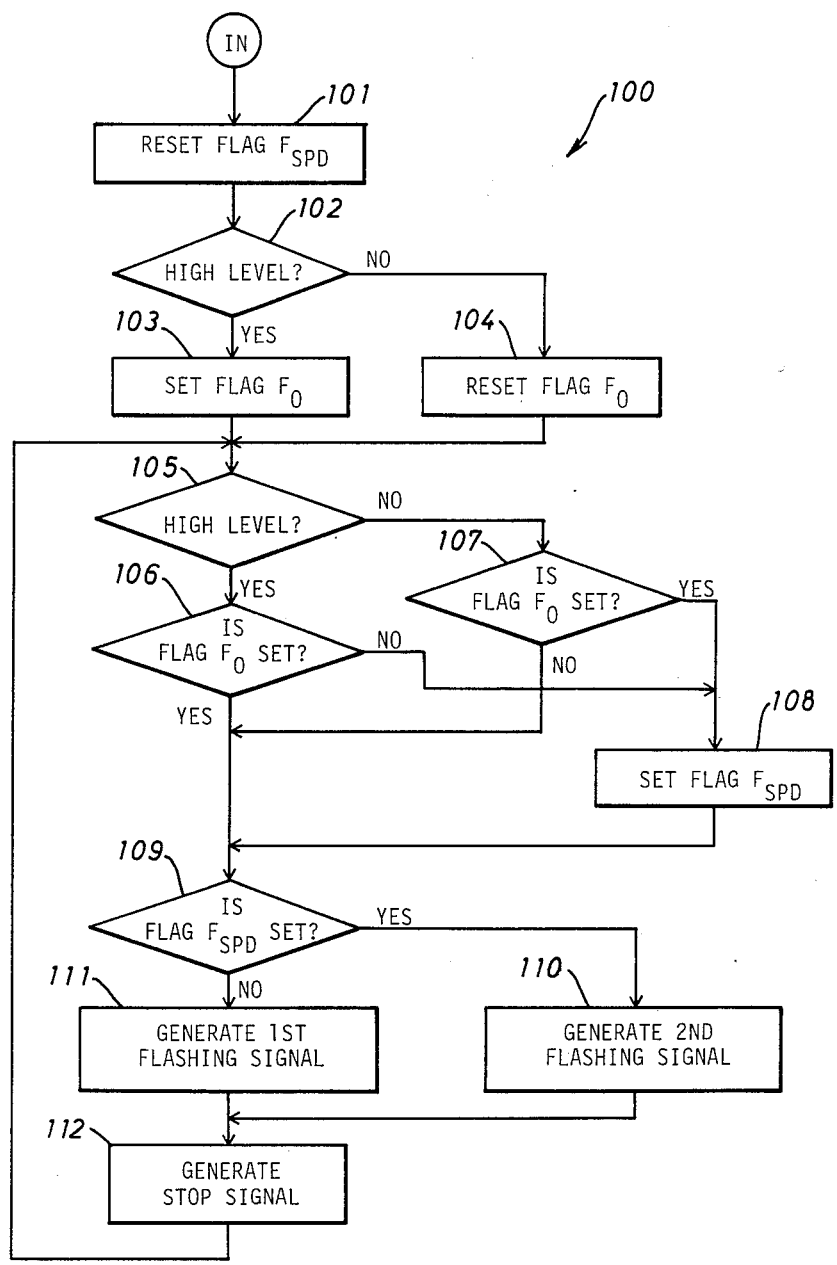
FIG. 5 is a detailed flow-chart illustrating the diagnosis routine of FIG. 2.

When the answer to the question at the above step 58 becomes "YES", CPU serves to halt execution for the automatic start and stop control of the engine and the main control program proceeds to a diagnosis routine 100 shown in the flow-charts of FIGS. 2 and 5. Then, the diagnosis routine 100 proceeds to a step 101 of FIG. 5 where CPU resets a flag $F_{SPD}$ which indicates that any speed pulse signal from the speed sensor 16 changes at its level. At this stage, the speed pulse signal actually appearing from the speed sensor 16 is maintained at a low or high level due to the above-noted disconnection of the drive cable 16c in spite of the movement of the vehicle. With the proceeding of the diagnosis routine 100 to a step 102 for discriminating as to the actual level of a speed pulse signal from the speed sensor 16, CPU discriminates as "YES" if a speed pulse signal actually appearing from the speed sensor 16 is maintained at a high level, as previously described. Then, the diagnosis routine 100 proceeds to a step 103 where CPU sets a flag $F_O$ indicative of a high level of a speed pulse signal from the speed sensor 16. Subsequently, the diagnosis routine 100 proceeds to the following step 105 for discriminating as to the actual level of a speed pulse signal from the speed sensor 16. Because at this stage the speed pulse signal from speed sensor 16 is continuously maintained at the high level, CPU discriminates as "YES" at the step 105 and the diagnosis routine 100 proceeds to a step 106 for discriminating as to set condition of the flag $F_O$. Then, CPU serves to discriminate as "YES" at the step 106 due to the set flag $F_O$ and the diagnosis routine 100 proceeds to a step 109 for discriminating set condition of the flag $F_{SPD}$.

When the diagnosis routine 100 proceeds to the step 109, as previously described, CPU discriminates as "NO" because of the reset flag $F_{SPD}$ to generate a first flashing signal which is applied to the indication lamp 26. Then, the lamp 26 is responsive to the first flashing signal from CPU to light intermittently in the first flashing manner of FIG. 6(A). Successively, the diagnosis routine 100 proceeds to a step 112 where CPU produces a stop signal upon receipt of which the transistor 31 cooperates with the starter relay 32 to disable activation of the starter motor 11. Thereafter, the execution of the diagnosis routine 100 through the steps 105, 106, 109, 111 and 112 is repetitively performed by CPU to light the lamp 26 in the first flashing manner and also to maintain deactivation of the starter motor 11 during the movement of the vehicle over a few meters. If the speed pulse signal from speed sensor 16 is maintained at a low level upon reach of the diagnosis routine 100 to the step 102 described above, CPU discriminates as "NO" to reset the flag $F_O$ at a step 104 and the diagnosis routine 100 proceeds to the step 105. Because the speed pulse signal from the speed sensor 16 is continuously maintained at the low level, CPU discriminates as "NO" at the step 105 and the diagnosis routine 100 proceeds to a step 107 for discriminating as to set condition of the flag $F_O$. When the answer at the step 107 becomes "NO" due to the reset flag $F_O$, the diagnosis routine 100 proceeds to the step 112 through the steps 109 and 111 where CPU lights the lamp 26 in the first flashing manner and also maintains the deactivation of starter motor 11 during the movement of the vehicle, as previously descrived.

Figure 6:
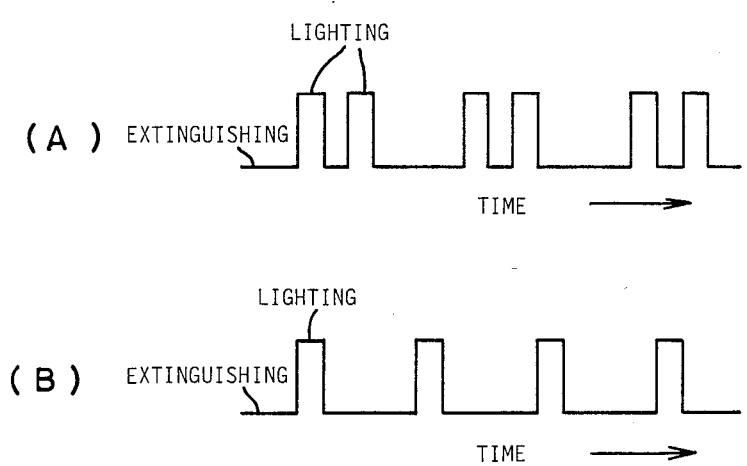
FIGS. 6A and 6B are a waveform diagram illustrating flashing manners of the indication lamp of FIG. 1 respectively.

From the above descriptions, it will be clearly understood that malfunction of the speed sensor 16 is recognized due to the indicating operation of lamp 26 in the first flashing manner of FIG. 6(A) and also that the starter motor 11 is maintained in its deactivation to prevent unexpected start of the engine during the execution of diagnosis routine 100. In this case, the lamp 26 is effectively used for both indications of the diagnosis of sensor 16 and the automatic start and stop control of the engine to eliminate a particular lamp for the diagnosis indication, and the step 58 of the main control program is provided in the flow from one of the steps 41, 46, 50, 51, 53, 57 to one of the step 42 and diagnosis routine 100 to surely discriminate closure of the diagnosis switch 25 upon each completion of execution of the main control program.

When execution of the main control program is again initiated after repair of the disconnection of the drive cable 16c and the diagnosis switch 25 is closed during movement of the vehicle, a diagnosis signal is produced from the switch 25 and is applied to the computer 20. At this stage, the drive cable 16c is correctly rotated in dependence upon rotation of the output shaft of the power transmission caused by the movement of the vehicle, and the disk 16a of speed sensor 16 is rotated to generate a speed pulse signal from the reed-switch 16b in sequence. When the answer at the step 58 becomes "YES", as previously described, the main control program proceeds to the diagnosis routine 100 where CPU resets the flag $F_{SPD}$ at the step 101. If a speed pulse signal appearing actually from the speed sensor 16 is at a high level, CPU discriminates as "YES" at the following step 102 to set the flag $F_O$ at the step 103. When the actual level of the speed pulse signal from sensor 16 changes into a low level at this stage, CPU discriminates as "NO" at the step 105 and the diagnosis routine 100 proceeds through the step 107 to a step 108 because of the set flag $F_O$ where CPU sets flag $F_{SPD}$ in such a manner to discriminate as "YES" at the following step 109. Thus, the diagnosis routine 100 proceeds to a step 110 and CPU generates a second flashing signal upon receipt of which the lamp 26 is intermittently lit in the second flashing manner shown in FIG. 6(B). If the speed pulse signal from sensor 16 is at a low level upon arrival of the diagnosis routine 100 to step 102 described above, CPU discriminates as "NO" to reset the flag $F_O$ at step 104. When the actual level of the speed pulse signal from sensor 16 changes into a high level at this stage, CPU discriminates as "YES" at the step 105 and the diagnosis routine 100 proceeds through the step 106 to the step 108 due to reset flag $F_O$ where the flag $F_{SPD}$ is set. Thus, the diagnosis routine 100 proceeds to step 110 where CPU generates a second flashing signal in response to which the lamp 26 is intermittently lit in the second flashing manner, as previously described.

As understood from the above descriptions, it will be clearly recognized that malfunction of the speed sensor 16 is correctly repaired due to the indicating operation of lamp 26 in the second flashing manner of FIG. 6(B). In addition, execution of diagnosis routine 100 proceeding from step 105 to step 112 through one of steps 110, 111 is performed within 10 milli-seconds repetitively upon ending the execution of diagnosis routine 100.

Although in the main control program of the above embodiment the discrimination at the step 58 is conducted on a basis of actuation of diagnosis switch 25, it may be also performed based on repetitive actuations of, for instance the setting-switch 17 within a short period of time (for example 2 to 3 seconds) to eliminate the diagnosis switch 25. It is also noted that although the above embodiment has been adapted to gasoline engines, the present invention may be adapted to a Diesel engine. In such application of the present invention, the ignition circuit 12 is replaced with a fuel injection control device for the engine which is arranged under control of the ignition relay 34. In the actual practices of the present invention, the reed-switch 16b of sensor 16 may be replaced with an appropriate magnetic flux detector, and the speed sensor assembly 16 may be also replaced with a slitted disk and photo-coupler assembly. Alternatively, each disk of the sensor assemblies may be mounted on another rotary member operated at the actual vehicle speed.

While in the above embodiment the present invention is adapted to automatic start and stop control of the vehicle engine, it may be also adapted to various vehicle control systems of the electronic type, such as an automatic transmission control system, antiskid control brake system and the like, where the actual vehicle speed is detected to ensure proper control of the travelling condition of the vehicle. In this case, a speed sensor for detection of the vehicle speed may be a reed-switch assembly which is secured to a vehicle body portion to form magnetic coupling relationship with a permanent magnet assembly fixed to a drive wheel of the vehicle.

Having now fully set forth both structure and operation of a preferred embodiment of the concept underlying the present invention, various other embodiments as well as certain variation and modifications of the embodiment herein shown and described will obviously occur to those skilled in the art upon becoming familiar with said underlying concept. It is to be understood, therefore, that within the scope of the appended claims, the invention may be practiced otherwise than as specifically set forth herein.

What is claimed is:

1. A diagnosis apparatus for detecting defects or malfunctions of a speed sensor assembly for use in combination with an automotive vehicle electric control system for controlling an operational state of said vehicle of an automotive vehicle, wherein said speed sensor assembly produces a speed signal which, when the vehicle is moving, includes a series of speed pulses indicative of movement of the vehicle to be applied to said electric control system, said diagnosis apparatus comprising:

means for operating said electric control system, during normal vehicle operation, responsive to speed pulses from said speed sensor assembly, including storing a level of said speed pulse signal and controlling said operational state based on comparisons of successive levels of said speed pulse signal with the stored level;

means for producing a diagnosis signal upon actuation thereof by a vehicle operator;

means responsive to said diagnosis signal for memorizing an instantaneous level of said speed pulse signal, comparing, following a memorization of said instantaneous level, successive levels of said speed pulses with the memorized level, and producing a first output signal when the successive levels of said speed pulses are the same as the memorized level and for producing a second output signal when the successive levels of said speed pulses are different from the memorized level;

means for indicating a defect or malfunction of said speed sensor assembly in response to said first output signal and indicating normal operation of said speed sensor assembly in response to said second output signal.

2. A diagnosis apparatus according to claim 1 wherein said indicating means comprises an indication lamp for generating a first flashing signal in response to said first output signal and for generating a second flashing signal in response to said second output signal.

3. A diagnosis apparatus according to claim 1 wherein said means for memorizing, comparing, and producing is constituted by a preprogrammed computer, and wherein said means for producing a diagnosis signal comprises a manually operable switch coupled to said computer.

4. An apparatus according to claim 3 wherein the speed pulse signal is a binary signal having high and low states.

5. An apparatus according to claim 4 wherein the memorized instantaneous level high.

6. An apparatus according to claim 4 wherein the memorized instantaneous level is low.

7. A method for diagnosing defects or malfunctions of a speed sensor assembly used in combination with an electric control system for controlling an operational state of an automotive vehicle, wherein said speed sensor assembly produces a speed signal which, when the vehicle is moving, includes a series of speed pulses indicative of movement of the vehicle to be applied to said electric control system, comprising the steps of:

operating said electric control system, during normal vehicle operation, responsive to speed pulses from said speed sensor assembly, including storing a level of said speed pulse signal and controlling said operational based on comparisons of successive levels of said speed pulse signal with the stored level;

to diagnose a speed sensor assembly malfunction, producing an electric diagnosis signal in response to a manual operation of a vehicle operator;

memorizing, in response to the diagnosis signal, an instantaneous level of the speed pulse signal;

comparing, following a memorization of an instantaneous level, successive levels of said speed pulses with the memorized level;

producing a first output signal when the successive levels of said speed pulses are the same as the memorized level and for producing a second output signal when the successive levels of said speed pulses are different from the memorized level;

indicating a defect or malfunction of said speed sensor assembly in response to said first output signal and indicating normal operation of said speed sensor assembly in response to said second output signal.

* * * * *